(12) United States Patent
Zin et al.

(10) Patent No.: US 7,622,390 B2
(45) Date of Patent: Nov. 24, 2009

(54) METHOD FOR TREATING A DIELECTRIC FILM TO REDUCE DAMAGE

(75) Inventors: Kelvin Kyaw Zin, Peabody, MA (US); Shin Okamoto, Kofu (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 11/763,620

(22) Filed: Jun. 15, 2007

(65) Prior Publication Data
US 2008/0311755 A1    Dec. 18, 2008

(51) Int. Cl.
*H01L 21/311* (2006.01)
(52) U.S. Cl. .............. 438/700; 438/637; 438/672; 438/622; 438/E21.251
(58) Field of Classification Search .......... 438/775, 438/791, 618–626, 637–639, 672–673, 424–428
See application file for complete search history.

(56) References Cited

U.S. PATENT DOCUMENTS

| | | | |
|---|---|---|---|
| 7,329,956 B1 * | 2/2008 | Yu et al. | 257/758 |
| 2001/0015046 A1 * | 8/2001 | Hong | 52/741.11 |
| 2002/0001952 A1 * | 1/2002 | Chooi et al. | 438/687 |
| 2005/0074961 A1 * | 4/2005 | Beyer et al. | 438/619 |
| 2006/0099802 A1 * | 5/2006 | Lin et al. | 438/637 |

* cited by examiner

*Primary Examiner*—Dung A. Le (57) ABSTRACT

A method of treating a dielectric layer on a substrate is described. The method comprises forming the dielectric layer on the substrate, wherein the dielectric layer comprises a dielectric constant value less than the dielectric constant of $SiO_2$. A feature pattern is formed in the dielectric layer using an etching process. Following the etching process, the feature pattern is treated using a nitrogen-containing plasma in order to form nitride surface layers by introducing nitrogen to the exposed surfaces of the dielectric layer in the feature pattern. Thereafter, the feature pattern is selectively etched to partially or fully remove the nitride surface layers.

20 Claims, 12 Drawing Sheets

METHOD FOR TREATING A DIELECTRIC FILM TO REDUCE DAMAGE

BACKGROUND OF THE INVENTION

1. Field of the Invention

The present invention relates to a method for treating a dielectric film, and more particularly to a method for treating exposed surfaces of a feature pattern formed in a low dielectric constant (low-k) dielectric film.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials during production of the IC. Such low-k materials have also proven useful for low temperature processing. Thus, in recent years, low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photoresist, or by chemical vapor deposition (CVD). Thus, the use of low-k materials is readily adaptable to existing semiconductor manufacturing processes.

While low-k materials are promising for fabrication of semiconductor circuits, it is recognized that these films also provide many challenges. First, low-k films tend to be less robust than more traditional dielectric layers and can be damaged during wafer processing, such as by etch and plasma ashing processes generally used in patterning the dielectric layer. Further, some low-k films tend to be highly reactive when damaged, particularly after patterning, thereby allowing the low-k material to absorb water and/or react with other vapors and/or process contaminants that can alter the electrical properties of the dielectric layer. Moreover, many low-k films comprise porous materials, which when etched to form a pattern therein, produce surfaces that expose pores and lead to a highly variable surface morphology.

SUMMARY OF THE INVENTION

The present invention relates to a method for etching a feature pattern in a substrate, and treating exposed surfaces in the feature pattern following the etching process.

According to one embodiment, a method of treating a dielectric layer on a substrate is described. The method comprises forming the dielectric layer on the substrate, wherein the dielectric layer comprises a dielectric constant value less than the dielectric constant of $SiO_2$. A feature pattern is formed in the dielectric layer using an etching process. Following the etching process, the feature pattern is treated using a nitrogen-containing plasma in order to form nitride surface layers by introducing nitrogen to the exposed surfaces of the dielectric layer in the feature pattern. Thereafter, the feature pattern is selectively etched to partially or fully remove the nitride surface layers.

According to another embodiment, a method of smoothing a dielectric layer on a substrate is described, comprising: forming the dielectric layer on the substrate, wherein the dielectric layer comprises a dielectric constant value less than the dielectric constant of $SiO_2$; forming a feature pattern in said dielectric layer using an etching process; nitriding one or more surfaces of the feature pattern using a nitrogen-containing plasma; and following the nitriding selectively etching the feature pattern to partially or fully remove the one or more nitride surfaces.

According to yet another embodiment, a liner removal process is described, comprising: forming a contact or via structure in a dielectric layer using a first etching process; exposing the contact or via structure in the dielectric layer to a nitrogen-containing plasma; and following the exposing, etching the contact or via structure through a silicon nitride layer underlying the dielectric layer using a second etching process.

DETAILED DESCRIPTION OF SEVERAL EMBODIMENTS

A method for treating a substrate following an etching process is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

In material processing methodologies, pattern etching comprises the application of a thin layer of light-sensitive material, such as photoresist, to an upper surface of a substrate, that is subsequently patterned in order to provide a mask for transferring this feature pattern to the underlying thin film during etching. The patterning of the light-sensitive material generally involves exposure of the lithographic layer to a geometric pattern of electromagnetic (EM) radiation using, for example, a micro-lithography system, followed by the removal of the irradiated regions of the tight-sensitive material (as in the case of positive photo-resist), or non-irradiated regions (as in the case of negative resist) using a developing solvent.

Additionally, multi-layer masks can be implemented for etching features in a thin film. For example when etching features in a thin film using a multi-layer mask, the mask pattern in the light-sensitive layer is transferred to the underlying layer(s) of the multi-layer mask using a separate etch step preceding the main etch step for the thin film.

During the dry development of underlying layers of the multi-layer mask and the transfer of the feature pattern to underlying layers using the multi-layer mask, plasma is often utilized to create and assist surface chemistry on a substrate to facilitate the removal of material from the substrate. During the etching of a substrate, plasma may be utilized to create reactive chemical species that are suitable for reacting with the certain materials on the surface of a substrate. Furthermore, during the etching of a substrate, plasma may be utilized to create charged species that are useful for delivering energy to surface reactions on the substrate.

Referring now to the drawings, wherein like reference numerals designate identical or corresponding parts throughout the several views, FIGS. 1A through 1D illustrate a method of forming a feature pattern in a dielectric film according to an embodiment. The feature pattern may, for example, comprise any pattern for an electronic structure including, but not limited to, a via, a trench, a contact, a gate, or any combination of two or more thereof. The method combines various aspects of the invention including using a multi-layer mask and treating the exposed surfaces of the etched feature pattern in the dielectric film in order to partially or fully remove damaged and/or rough surface layers on the dielectric film as a consequence of the dielectric film etching or ashing processes. However aspects of the process in FIGS. 1A through 1D may be used separately from one another as discussed below. Additionally, FIG. 2 presents a flow chart 500 of performing the method according to one embodiment.

Figure 1A:
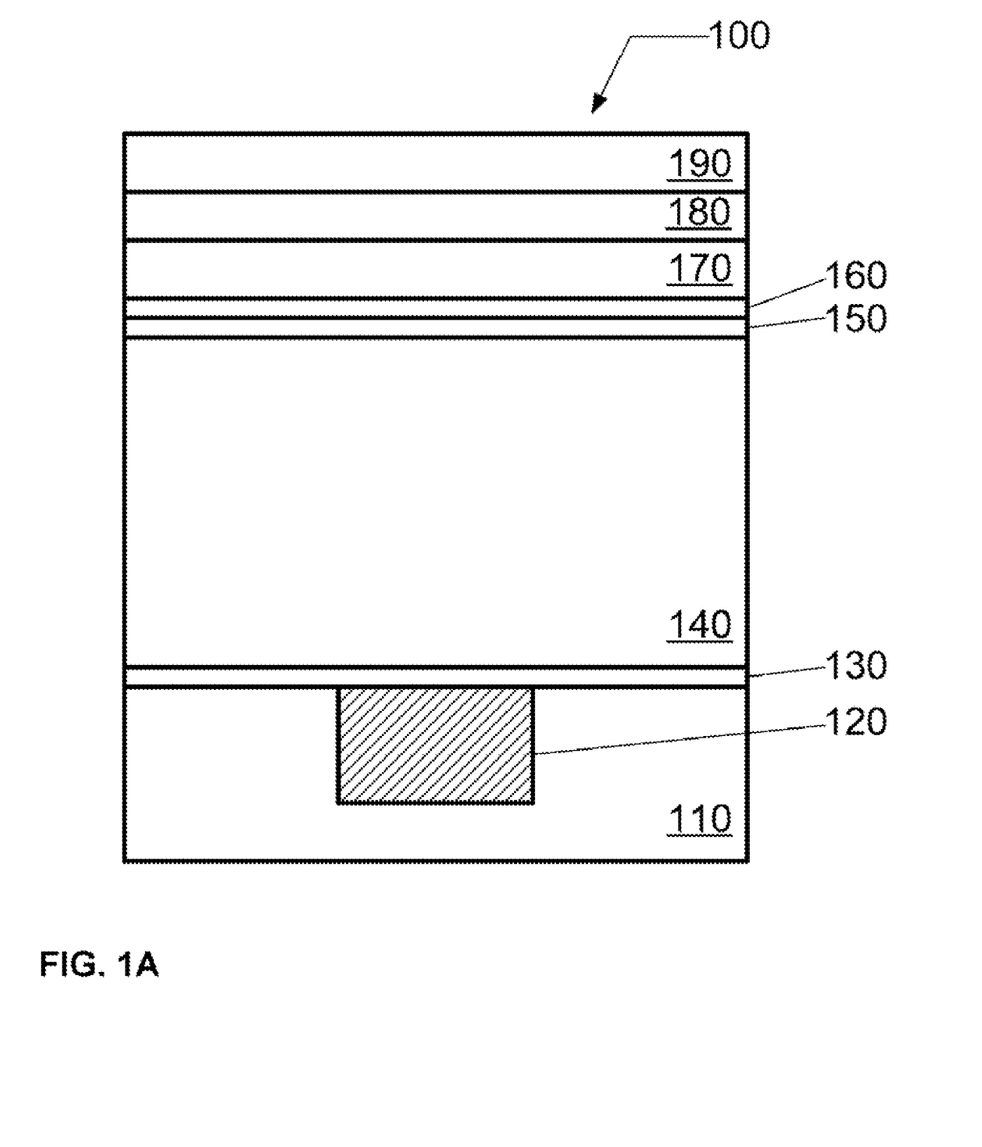
FIGS. 1A through 1D illustrate a schematic representation of a procedure for etching a feature pattern in a substrate according to an embodiment.
Figure 2:
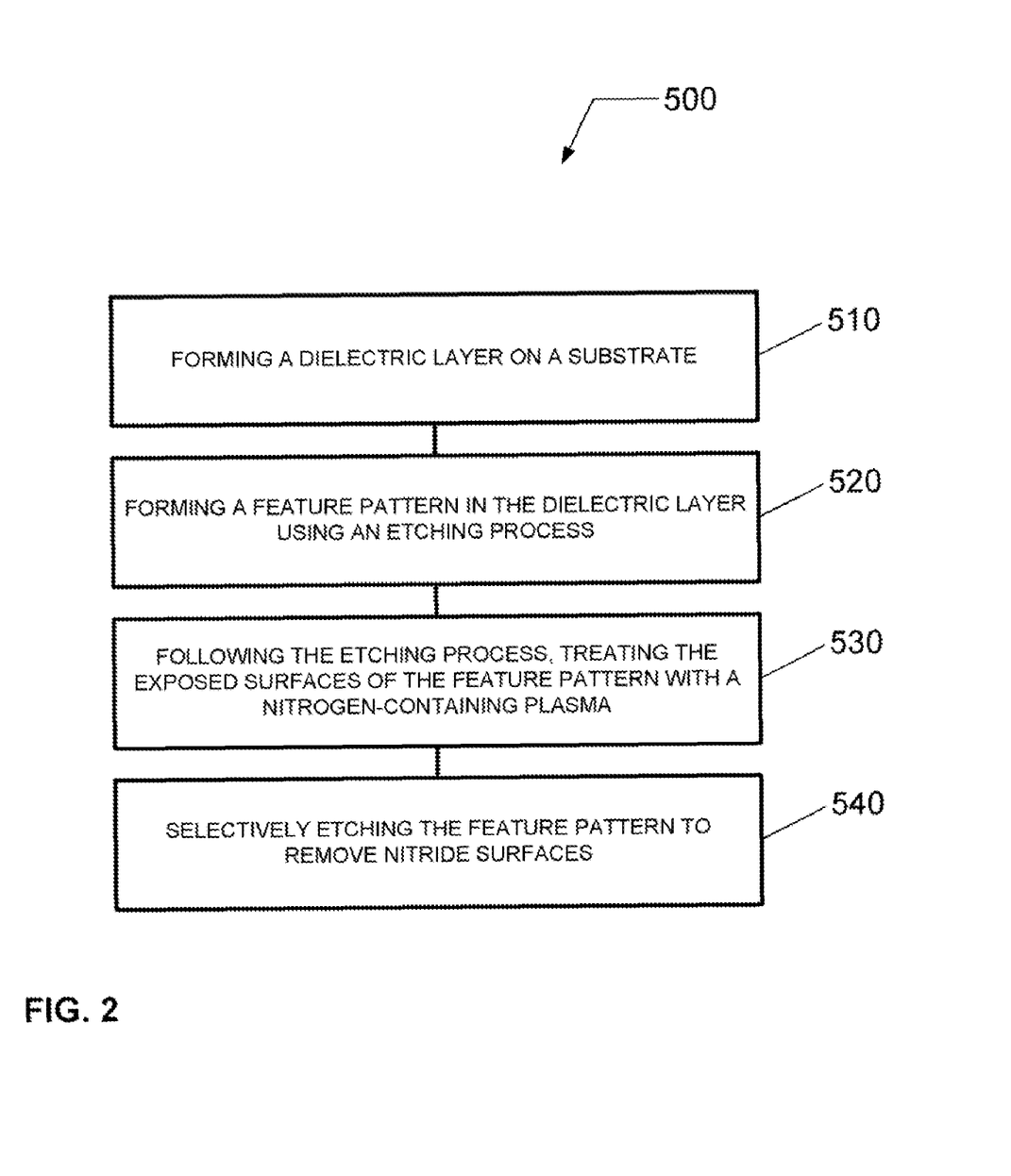
FIG. 2 provides a flow chart illustrating a method of etching a feature pattern in a substrate according to an embodiment.

As shown in FIGS. 1A and 2, a dielectric layer 140 is formed in step 510 on an upper surface of a substrate 110 that may or may not include additional layers. The substrate 110 may be a semiconductor, a metallic conductor, or any other substrate to which the dielectric layer 140 is to be formed upon. Additionally, the substrate 110 may comprise a semiconductor substrate, a wafer, a flat panel display or a liquid crystal display.

The dielectric layer 140 has a nominal dielectric constant value less than the dielectric constant of $SiO_2$, which is approximately 4 (e.g., the dielectric constant for thermal silicon dioxide can range from 3.8 to 3.9). More specifically, the dielectric layer 140 may have a dielectric constant of less than 3.0, or a dielectric constant ranging from 1.6 to 2.7.

The dielectric layer 140 can be formed using chemical vapor deposition (CVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The SOD track system can be configured for processing substrate sizes of 100 mm, 200 mm, 300 mm, and greater. Other systems and methods for forming a dielectric film on a substrate are well known to those skilled in the a of both spin-on dielectric technology and (PE)CVD dielectric technology.

The dielectric layer 140 can, for example, be characterized as a low dielectric constant (or low-k or ultra low-k) dielectric film. The dielectric layer 140 may include an organic, inorganic, or inorganic-organic hybrid material or a combination of two or more thereof. The dielectric layer 140 may contain Si, C, O, and optionally H. Additionally, the dielectric layer 140 may be porous or non-porous. For example, the dielectric layer 140 may include an inorganic, silicate-based material, such as oxidized organosilane (or organo siloxane), deposited using CVD techniques. Examples of such films include Black Diamond™ CVD organosilicate glass (OSG) films commercially available from Applied Materials Inc., or Coral™ CVD films commercially available from Novellus Systems. Additionally, for example, porous dielectric layers can include single-phase materials, such as a silicon oxide-based matrix having —$CH_3$ bonds that are broken during a curing process to create small voids (or pores). Additionally, for example, porous dielectric layers can include dual-phase materials, such as a silicon oxide-based matrix having pores of organic material (e.g., porogen) that is evaporated during a curing process.

Alternatively, the dielectric layer 140 may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the dielectric layer 140 can include an organic material deposited using SOD techniques. Examples of such films include SiLK-I, SiLK-J, SiLK-H, SiLK-D, and porous SiLK semiconductor dielectric resins commercially available from Dow Chemical, and FLARE™, and Nano-glass commercially available from Honeywell.

The substrate 110 or another layer formed on the substrate 110 can comprise a metal line 120 formed therein, such as a copper (Cu) line. Additionally, a liner 130 can be inserted between the dielectric layer 140 and the metal line 120. For example, the liner 130 can comprise silicon nitride (e.g., $Si_3N_4$, or more generally, $Si_xN_y$).

As shown in FIG. 1A, a transition layer 150 may be formed on the dielectric layer 140, and a cap layer 160 may be formed on the transition layer 150. The transition layer 150 may comprise a film containing Si, C, O, and H. Additionally, for example, the cap layer 160 can comprise a silicon oxide layer, such as a TEOS oxide formed using tetraethyl orthosilicate (TEOS) via thermal chemical vapor deposition (CVD).

As shown in FIG. 1A, once the dielectric layer 140 is prepared, a multi-layer mask is formed. The multi-layer mask comprises a lithographic layer 190, a second mask layer 180 and an optional third mask layer 170.

The lithographic layer 190 may comprise a layer of light-sensitive material, such as photoresist. The photoresist layer may comprise a 248 nm (nanometer) resist, a 193 nm resist, a 157 nm resist, or an EUV (extreme ultraviolet) resist. The photoresist layer can be formed using a track system. For example, the track system can comprise a Clean Track ACT 8, ACT 12, or Lithius resist coating and developing system commercially available from Tokyo Electron Limited (TEL). Other systems and methods forming a photoresist layer on a substrate are well known to those skilled in the art of spin-on resist technology.

The second mask layer 180 can comprise an anti-reflective coating (ARC) layer, such as a silicon-containing ARC layer. For example, the second mask layer 180 may comprise a silicon-containing ARC commercially available as Sepr-Shb Aseries SiARC from Shin Etsu Chemical Co., Ltd. The second mask layer 180 may, for example, be applied using spin coating technology, or a vapor deposition process.

The optional third mask layer 170 may comprise an inorganic layer or an organic layer. For example, the optional third mask layer 170 may comprise an organic planarization layer (OPL). The OPL can include a photo-sensitive organic polymer or an etch type organic compound. For instance, the photo-sensitive organic polymer may be polyacrylate resin, epoxy resin phenol resin, polyamide resin, polyimide resin, unsaturated polyester resin, polyphenylenether resin, polyphenylenesulfide resin, or benzocyclobutene (BCB). These materials may be formed using spin-on techniques.

The lithographic layer 190 is imaged with an image pattern. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Thereafter, the image pattern is developed in the lithographic layer 190 to form a mask pattern. For example, the mask pattern can include a trench pattern, a via pattern, a contact pattern, etc. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

The mask pattern formed in the lithographic layer 190 is transferred to the second mask layer 180 and the optional third mask layer 170 using a dry process, such as a dry plasma etching process. The dry plasma etching process comprises introducing a process gas to the plasma processing system according to a process recipe, forming plasma from the process gas in the plasma processing system according to the process recipe, and exposing the substrate to the plasma.

Depending on the feature pattern to be formed in the underlying dielectric layer 140, one or more lithographic layers 190 may be utilized. When preparing a trench-via structure, or dual damascene structure, it is necessary to form a trench pattern and a via pattern in the mask layer. As an example, a via pattern may be formed in a first lithographic layer using a first lithographic process, and this pattern can be transferred to the underlying mask layer(s) using an etching process, and partially transferred to the underlying dielectric layer 140 using an etching process. Thereafter, a trench pattern may be formed in a second lithographic layer using a second lithographic process, and the trench pattern may be transferred to the underlying mask layer(s) using an etching process, and partially transferred to the underlying dielectric layer 140 using an etching process while completing the transfer of the via pattern.

Figure 1B:
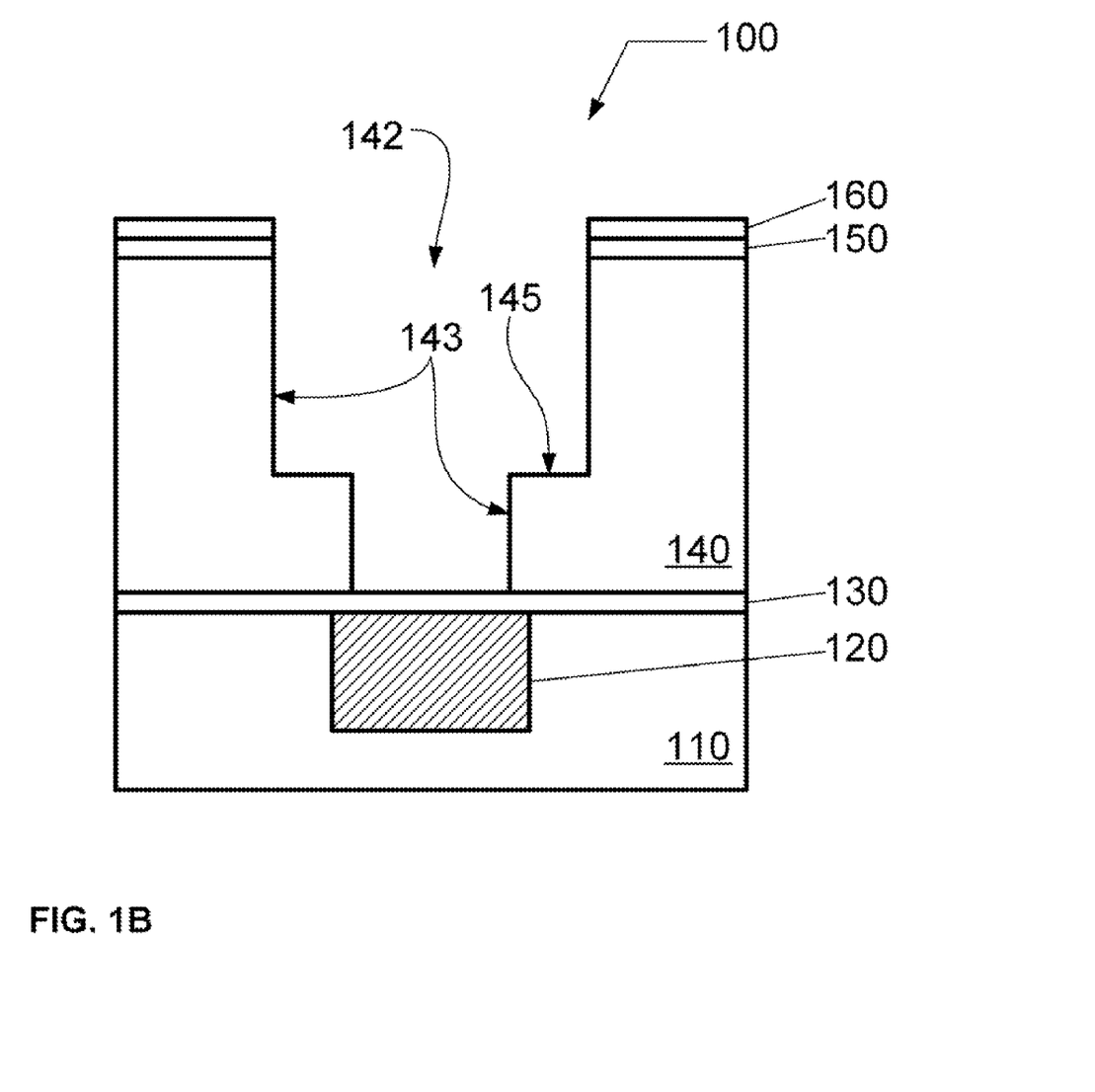

As shown in FIG. 1B and in 520, the mask pattern formed in the multi-layer mask is transferred to the dielectric layer 140 using an etching process to form feature pattern 142. For example, as shown in FIG. 18, the feature pattern may include a trench-via structure. The etching process can include a dry plasma etching process or a dry non-plasma etching process, or a wet etching process. For example, the etching process may include using plasma formed from a process gas comprising a fluorocarbon gas, such as those chemical compositions represented as $C_xF_y$, where x and y are integers greater than or equal to unity (e.g., $C_4F_8$, $C_5F_8$, $C_3F_6$, $C_4F_6$, $CF_4$, etc.), or a fluorohydrocarbon gas, such as those chemical compositions represented as $C_xF_yH_z$, where x, y and z are integers greater than or equal to unity (e.g., $CHF_3$, $CH_2F_2$, etc.), or both a fluorocarbon gas and a fluorohydrocarbon gas. Additionally, the process gas may include an additive gas, such as $O_2$, $CO$, $CO_2$, $NO$, $N_2O$, $NO_2$, or any combination of two or more thereof. Furthermore, the process gas may include an inert gas, such as a noble gas.

Referring still to FIG. 1B, the formation of the feature pattern 142 in the dielectric layer 140 may include one or more steps. Furthermore, one or more lithographic layers 190 with one or more mask patterning steps may be utilized to form a trench and via structure, or trench structure, or via structure in the dielectric layer 140. For example, the feature pattern 142 formed using one or more mask layers can include a dual damascene structure.

Following the formation of the feature pattern 142 in the dielectric layer 140, the lithographic layer 190, the second mask layer 180 and the optional third mask layer 170, or any remaining portions thereof are removed using an ashing (or stripping) process. For example, the ashing process can include a dry plasma ashing process. Additionally, for example, the dry ashing process can include an ashing process gas including $O_2$, $CO$, $CO_2$, $NO$, $N_2O$, $NO_2$, or any combination of two or more thereof.

During the etching process for forming the feature pattern 142 in dielectric layer 140, as well as the ashing process to remove the lithographic layer 190, interior surfaces 143 and 145 of the feature pattern 142 are exposed to plasma and harmful chemistries. For example, when forming a trench-via structure during the etching process, the inventors have observed surface damage including "pitting" on the horizontally oriented interior surfaces 145, as well as some roughness or striations on the vertically oriented interior surfaces 143. Additionally, for example, advanced (porous and non-porous) dielectric materials can be damaged when exposed to these harmful etching, stripping and/or ashing processes. Moreover, for example, in porous films, the exposure of open pores can lead to rough surface layers having highly variable surface morphology. Thereafter, when forming barrier layer(s), seed layer(s), etc. in preparation for metallization of the feature pattern 142, the damaged and/or rough surface layer(s) 143 and 145 may be partially or fully removed, and/or smoothed.

Figure 1C:
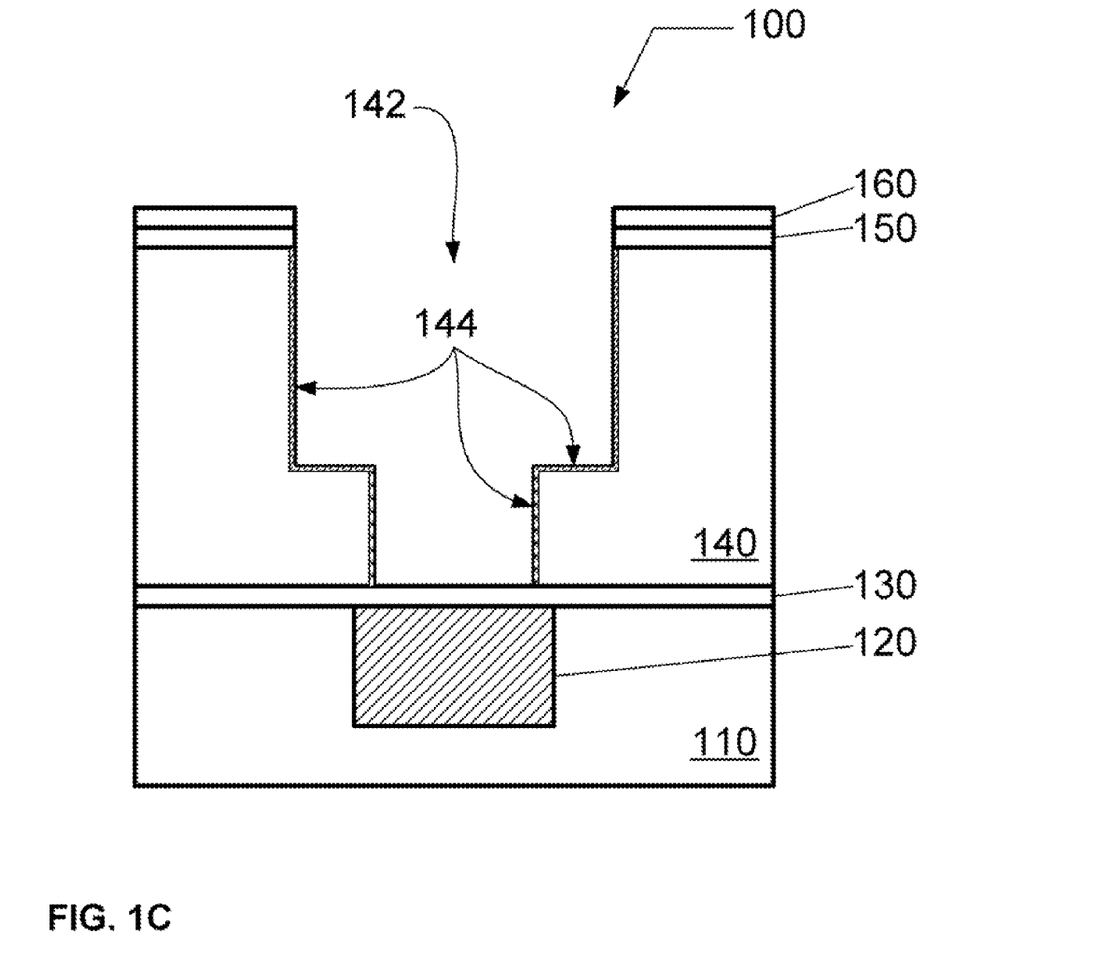

In step 530 and as shown in FIG. 1C, the surface layer(s) 143 of the feature pattern 142 in dielectric layer 140 are exposed to a nitrogen-containing plasma. The nitrogen-containing plasma can be formed from a nitrogen-containing gas, such as $N_2$, $NO$, $NO_2$, $N_2O$, or $NH_3$, or a combination of two or more thereof. The nitrogen-containing plasma may be formed remotely or locally (relative to the substrate). Additionally, the nitrogen-containing gas can include an inert gas, such as a noble gas. The exposure of the surface layer(s) 143 and 145 to a nitrogen-containing plasma facilitates the nitridation of the surface layers to form nitride surface layer(s) 144 by introducing nitrogen to the surface layer(s) 143 and 145 of exposed surfaces of the dielectric layer 140 in the feature pattern 142.

Figure 1D:
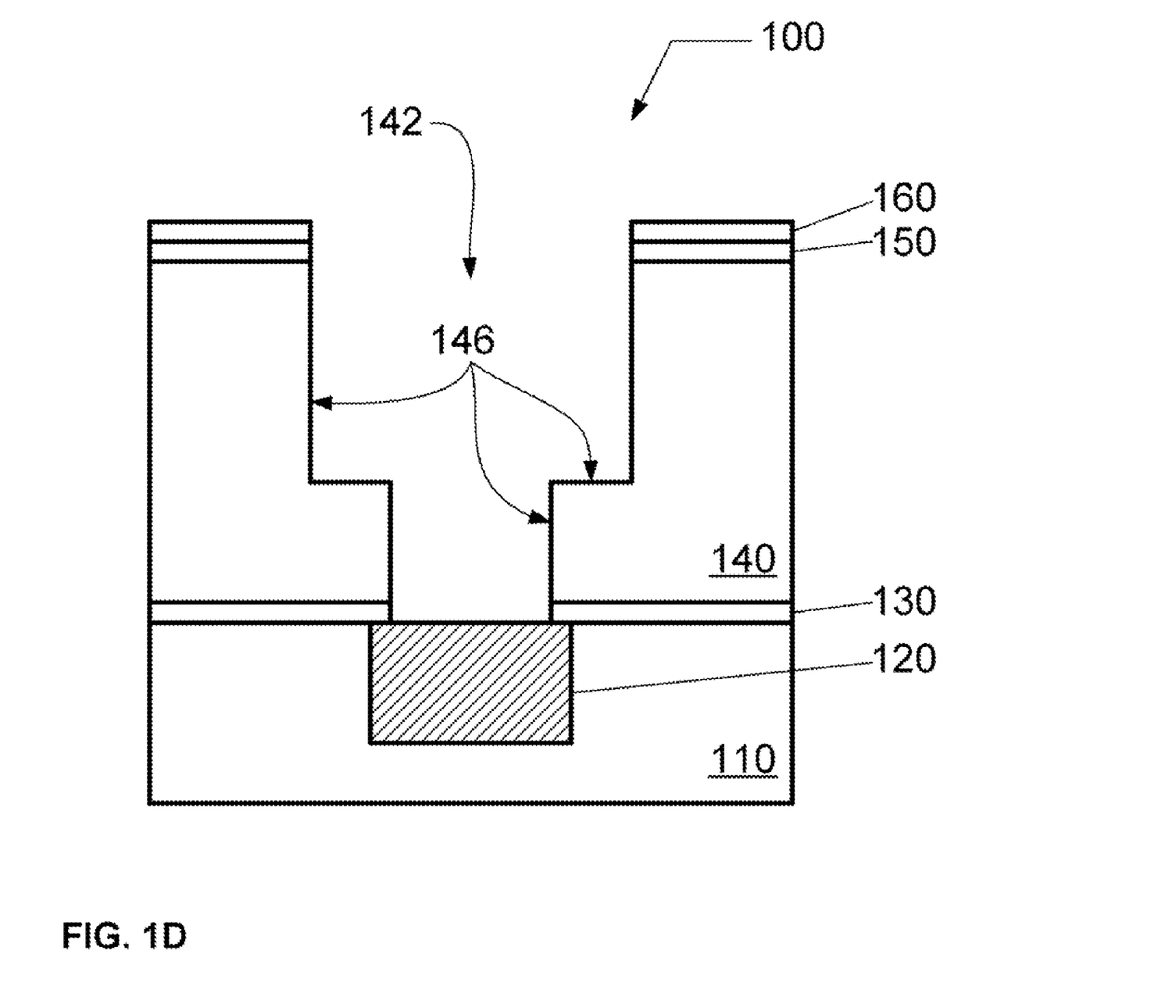

In step 540 and as shown in FIG. 1D, the nitride surface layer(s) 144 of the feature pattern 142 in dielectric layer 140 are selectively removed using an etching process selective to nitride materials, such as silicon nitride. The selective etching process may include a selective dry plasma etching process. The inventors have observed a reduction in the surface roughness of the resulting surfaces 146 when performing this procedure.

The selective etching process may include using plasma formed from a process gas comprising a fluorocarbon gas, such as those chemical compositions represented as $C_xF_y$, where x and y are integers greater than or equal to unity (e.g., $C_4F_8$, $C_5F_8$, $C_3F_6$, $C_4F_6$, $CF_4$, etc.), or a fluorohydrocarbon gas, such as those chemical compositions represented as $C_xF_yH_z$, where x, y and z are integers greater than or equal to unity (e.g., $CHF_3$, $CH_2F_2$, etc.), or both a fluorocarbon gas and a fluorohydrocarbon gas. Additionally, the process gas may include an additive gas, such as $O_2$, CO, $CO_2$, NO, $N_2O$, $NO_2$, or any combination of two or more thereof. Furthermore, the process gas may include an inert gas, such as a noble gas. For example, the selective etching process can include a process gas comprising $CF_4$, $CHF_3$, Ar, $CO_2$, and CO.

Furthermore, as shown in FIG. 1D the selective etching process that facilitates the partial or full removal of nitride surface layers 144 on feature pattern 142 can be utilized to transfer the feature pattern through liner 130. In doing so, subsequent metallization processes may be performed to make conductive contact with metal line 120.

Figure 3:
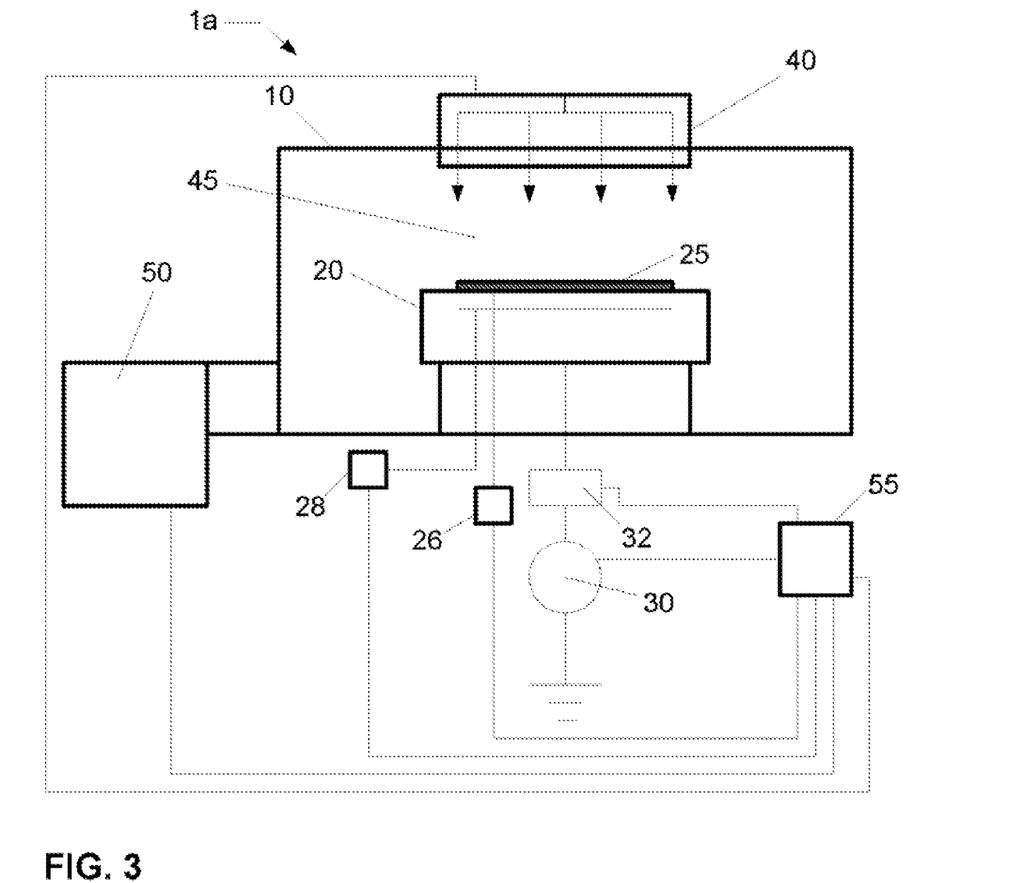
FIG. 3 shows a schematic representation of a plasma processing system according to an embodiment.

According to one embodiment, a plasma processing system 1a configured to perform one or more of the above identified process conditions is depicted in FIG. 3 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a predetermined materials process and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system 26 can comprise a two-zone gas distribution system, wherein the helium gas-gap pressure can be independently varied between the center and the edge of substrate 25.

In the embodiment shown in FIG. 3, substrate holder 20 can comprise an electrode (not shown) through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the plasma processing system 1a can operate as a reactive ion etch (RIE) reactor, wherein the chamber 10 and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas supply system 26, and/or the electrostatic clamping system 28. For example, a program stored in the memory can be utilized to activate the inputs to the aforementioned components of plasma processing system 1a according to a process recipe in order to perform a plasma assisted process on substrate 25. One example of controller 55 is a DELL PRECISION WORKSTATION 610™, available from Dell Corporation, Austin, Tex.

Controller 55 can be locally located relative to the plasma processing system 1a, or it can be remotely located relative to the plasma processing system 1a. For example, controller 55 can exchange data with plasma processing system 1a using a direct connection, an intra net, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 4, plasma processing system 1b can be similar to the embodiment of FIG. 3 and further comprise either a stationary, or mechanically or electrically rotating magnetic field system 60, in order to potentially increase plasma density and/or improve plasma processing uniformity, in addition to those components described with reference to FIG. 3. Moreover, controller 55 can be coupled to magnetic field system 60 in order to regulate the speed of rotation and field strength. The design and implementation of a rotating magnetic field is well known to those skilled in the art.

Figure 4:
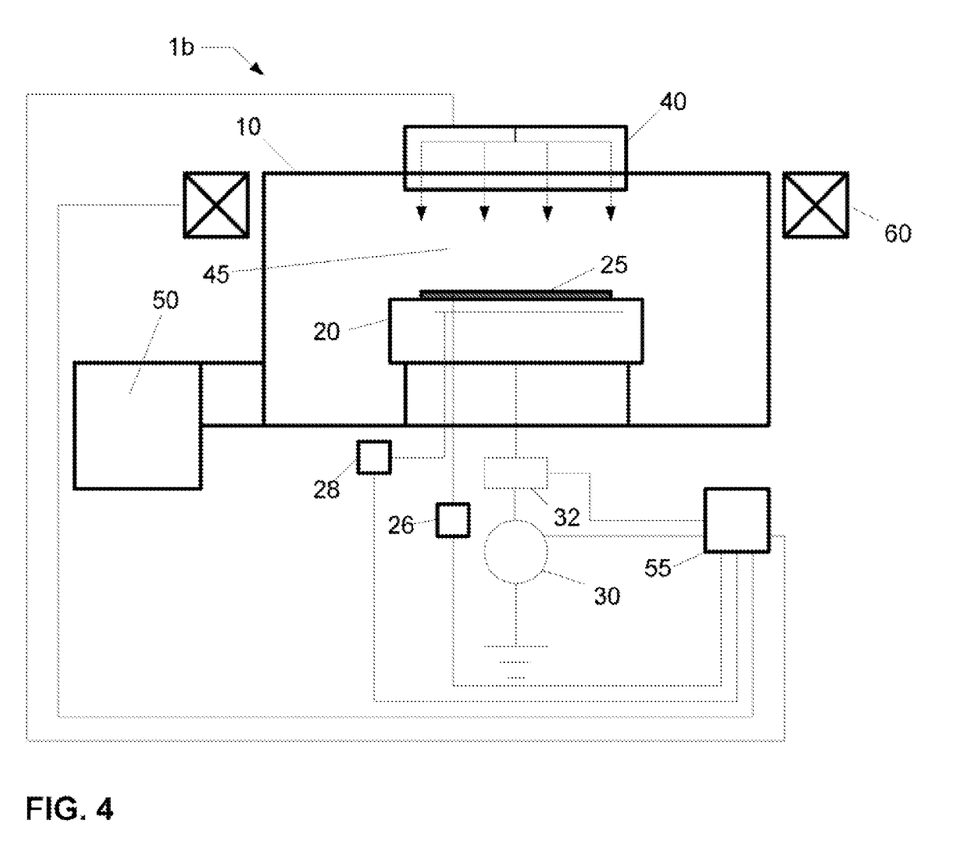
FIG. 4 shows a schematic representation of a plasma processing system according to another embodiment.
Figure 5:
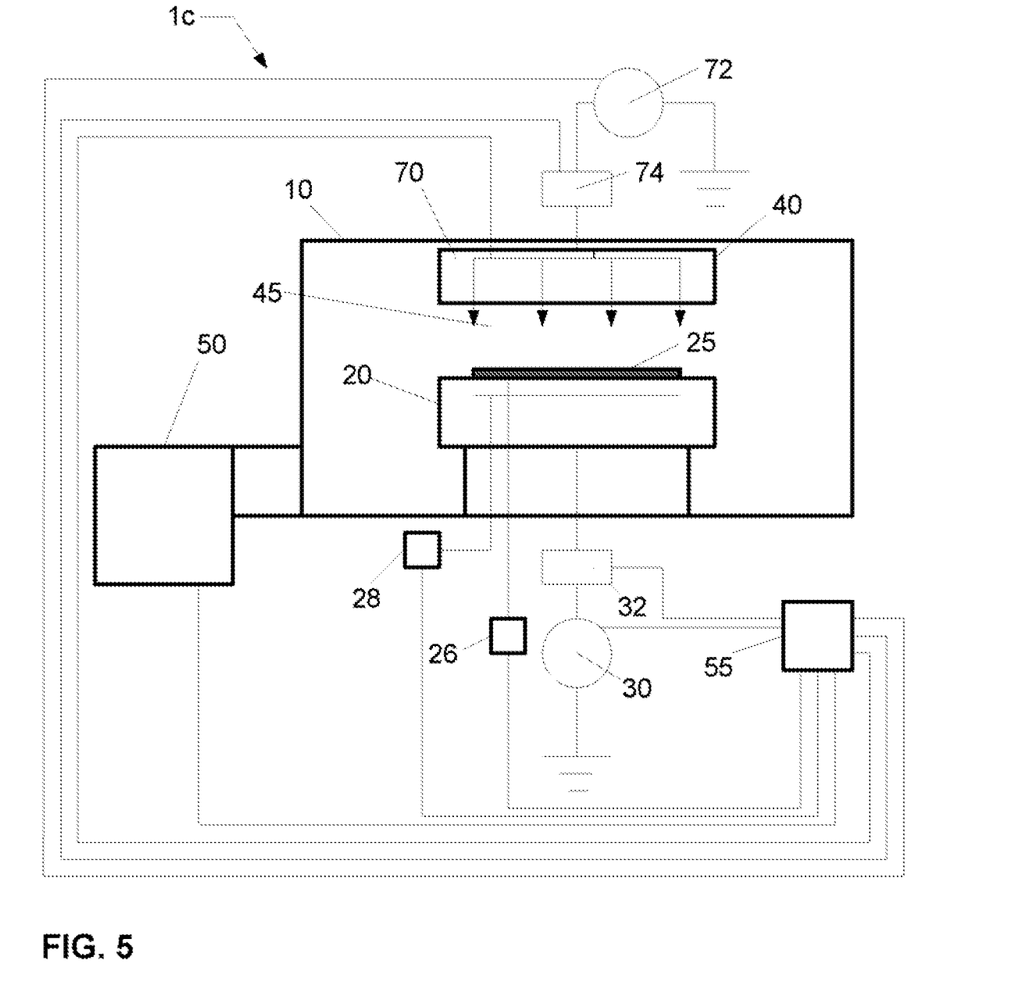
FIG. 5 shows a schematic representation of a plasma processing system according to another embodiment.

In the embodiment shown in FIG. 5, plasma processing system 1c can be similar to the embodiment of FIG. 3 or FIG. 4, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1, MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 6:
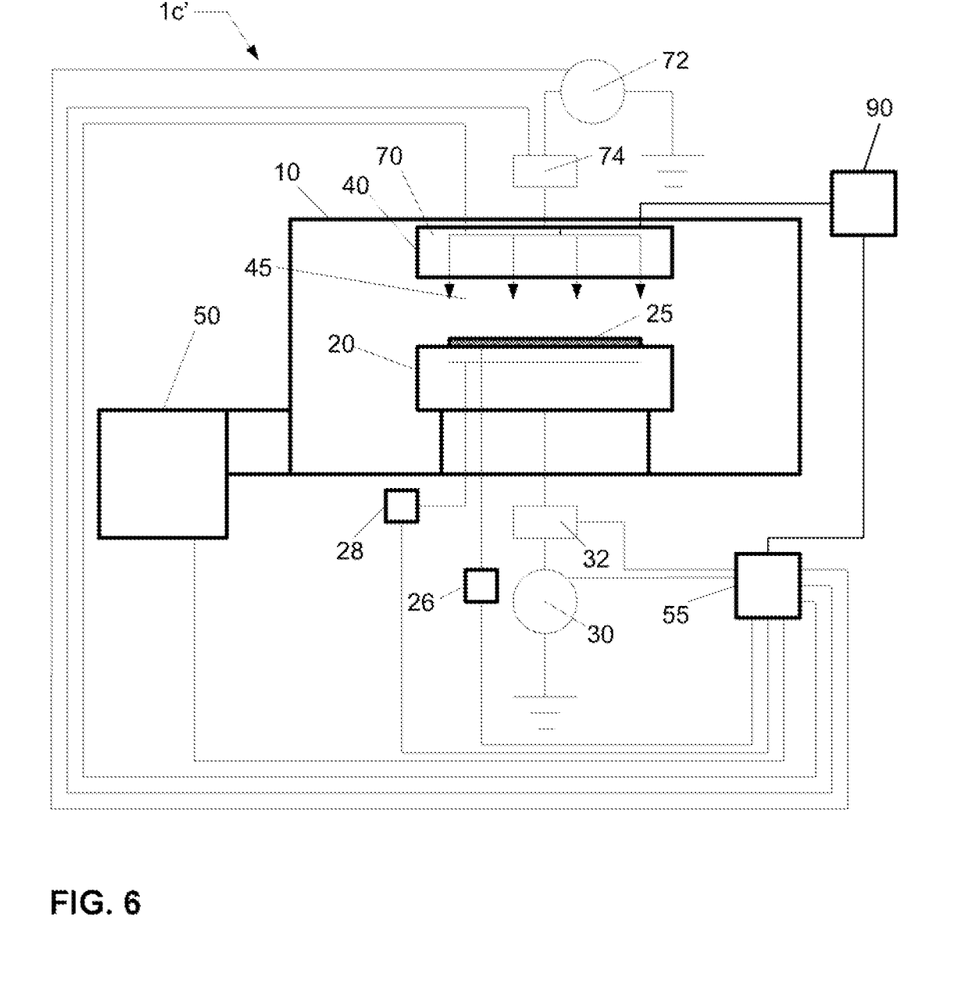
FIG. 6 shows a schematic representation of a plasma processing system according to another embodiment.

In the embodiment shown in FIG. 6, plasma processing system 1c' can be similar to the embodiment of FIG. 5, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring adjusting, or controlling the polarity, current, voltage, or on/off state of the DC power supply 90. Once plasma is formed, the DC power supply 90 facilitates the formation of a ballistic electron beam. An electrical filter may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 7:
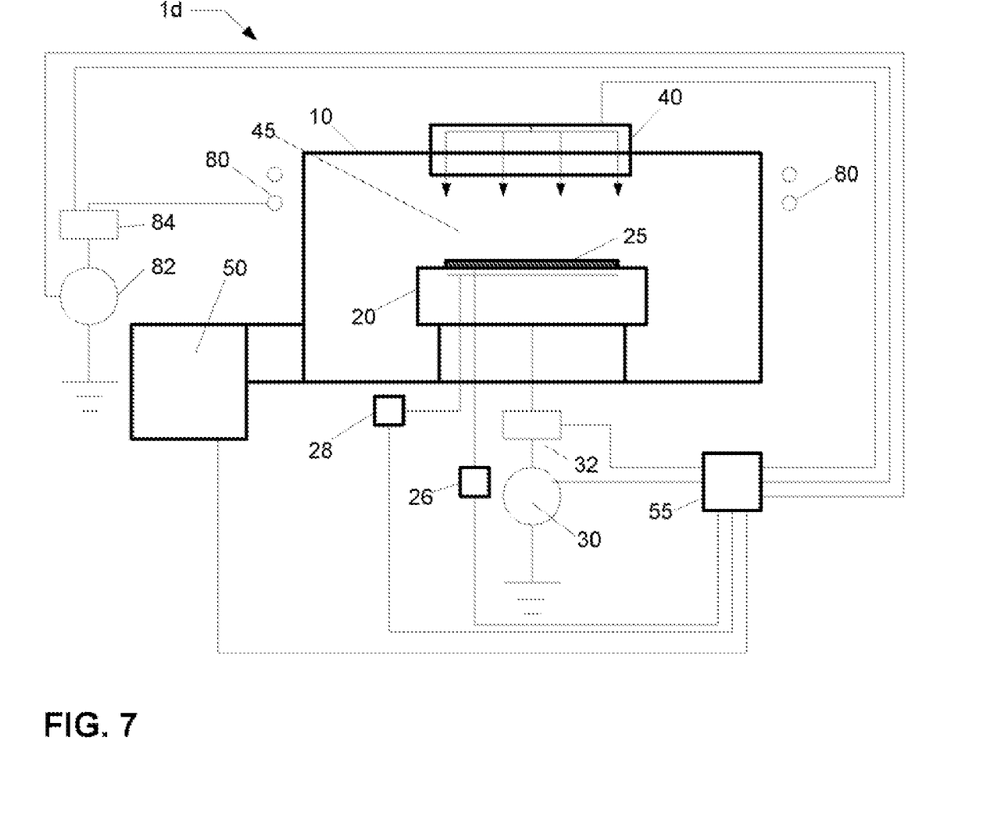
FIG. 7 shows a schematic representation of a plasma processing system according to another embodiment.

In the embodiment shown in FIG. 7, the plasma processing system 1d can be similar to the embodiment of FIG. 3, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 8:
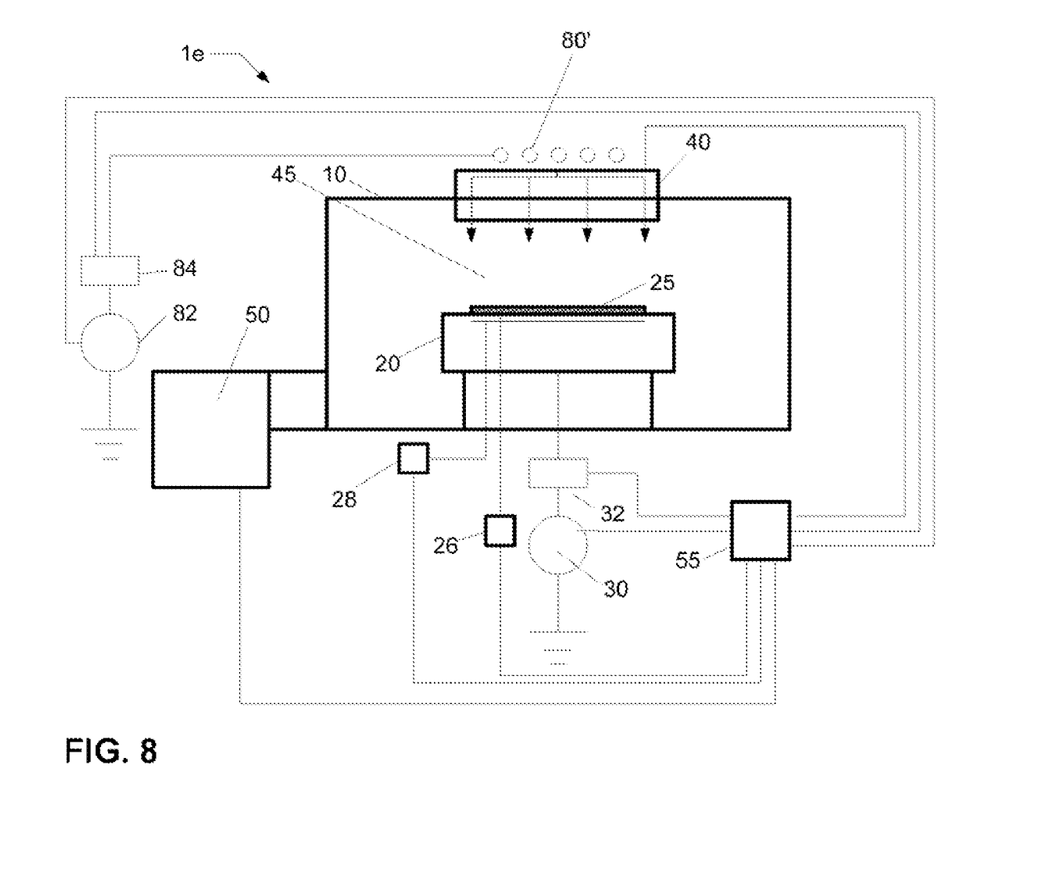
FIG. 8 shows a schematic representation of a plasma processing system according to another embodiment.

In an alternate embodiment, as shown in FIG. 8, the plasma processing system 1e can be similar to the embodiment of FIG. 7, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 9:
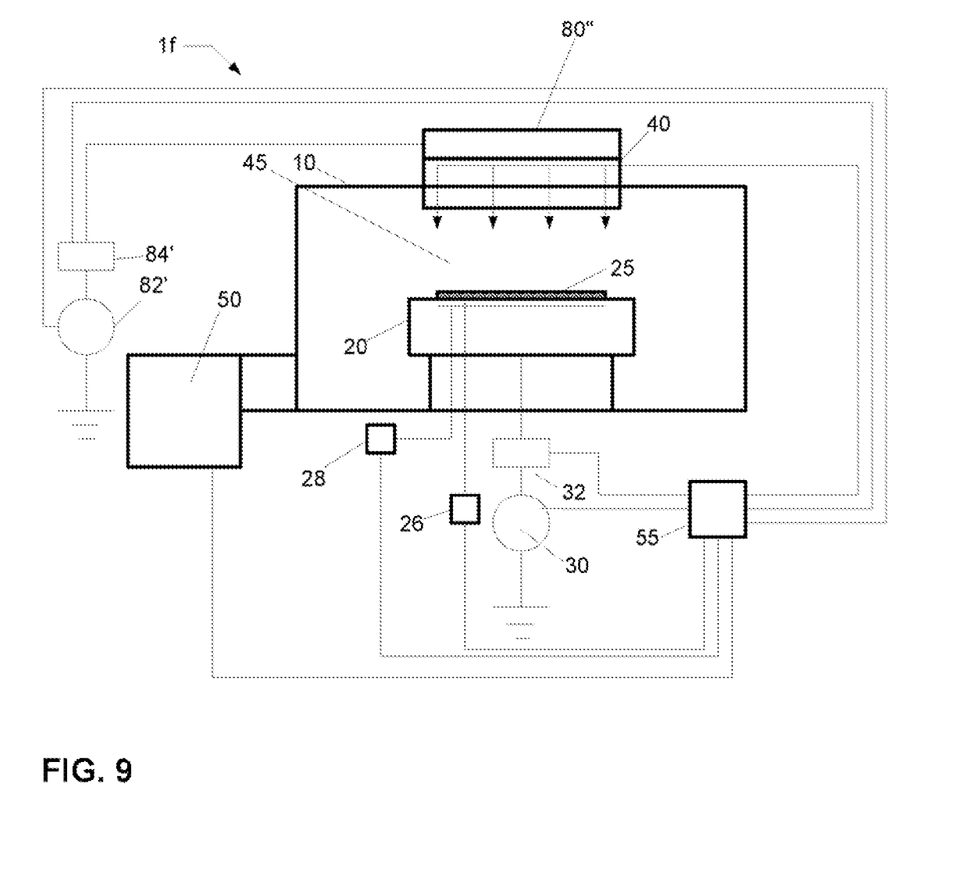
FIG. 9 shows a schematic representation of a plasma processing system according to another embodiment.

In the embodiment shown in FIG. 9, the plasma processing system 1f can be similar to the embodiment of FIG. 3, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

In the following discussion, a method of treating exposed surfaces on a feature pattern in a dielectric layer on a substrate following an etching process is presented. The treatment of the exposed surfaces of the feature pattern comprises exposing the feature pattern to a nitrogen-containing plasma, followed by removing the nitridated surface layers using a selective etching process. The treatment process and the selective etching process can be performed in the same plasma processing system, or they may be performed in separate plasma processing systems. Additionally, the treatment process and the preceding dry plasma etching process can be performed in the same plasma processing system, or they may be performed in separate plasma processing systems. For example, the plasma processing system can comprise various elements, such as described in FIGS. 3 through 9, and combinations thereof.

In one embodiment, a method of treating a feature pattern in a dielectric layer using a nitrogen-containing plasma, comprises a process chemistry having a nitrogen-containing gas, such as $N_2$, NO, $NO_2$, $N_2O$, or $NH_3$, or a combination of two or more thereof, and optionally an inert gas, such as a noble gas (e.g., Ar). For example, a process parameter space can comprise a chamber pressure of about 1 to about 1000 mTorr, a nitrogen-containing process gas flow rate ranging from about 1 to about 1000 sccm, an optional Ar process gas flow rate ranging from about 1 sccm to about 2000 sccm, an upper electrode (e.g., element 70 in FIG. 5) RF bias ranging from about 0 to about 2000 W, and a lower electrode (e.g., element 20 in FIG. 5) RF bias ranging from about 10 to about 2000 W. Also, the upper electrode bias frequency can range from about 0.1 MHz to about 200 MHz, e.g., 60 MHz. In addition, the lower electrode bias frequency can range from about 0.1 MHz to about 100 MHz, e.g. 2 MHz.

In another embodiment, a method of selectively removing nitridated surfaces on a feature pattern in a dielectric layer following the treatment of the feature pattern using a nitrogen-containing plasma, comprises a process chemistry having a fluorocarbon gas, such as $CF_4$, and a hydrofluorocarbon gas, such as trifluoromethane ($CHF_3$), and optionally an inert gas, such as argon (Ar), and optionally an additive gas, such as $O_2$, CO, $CO_2$, NO, $N_2O$, $NO_2$, or any combination of two or more thereof. For example, a process parameter space can comprise a chamber pressure of about 5 to about 1000 mTorr, a fluorocarbon process gas flow rate ranging from about 1 to about 1000 sccm, a hydrofluorocarbon process gas flow rate ranging from about 1 to about 1000 sccm, an optional Ar process gas flow rate ranging from about 1 sccm to about 2000 sccm, an optional oxygen-containing gas flow rate ranging from about 1 to about 1000 sccm, an upper electrode (e.g., element 70 in FIG. 5) RF bias ranging from about 0 to about 2000 W, and a lower electrode (e.g., element 20 in FIG. 5) RF bias ranging from about 10 to about 2000 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

In one example, a method of treating a line pattern in a Si, C, O, H-containing low-k dielectric layer following a dry plasma etching process to transfer the line pattern to the dielectric layer and a dry plasma ashing process to remove the mask layer(s) is described. The treatment process comprises treating the line pattern with a nitrogen-containing plasma using process chemistry containing $N_2$ process gas. A process parameter space can comprise a chamber pressure of about 15 mTorr, a $N_2$ process gas flow rate of about 180 sccm, an upper electrode (e.g., element 70 in FIG. 5) RF bias of about 0 W, and a lower electrode (e.g., element 20 in FIG. 5) RF bias of about 800 W. Also, the upper electrode bias frequency can range from about 0.1 MHz to about 200 MHz, e.g. 60 MHz. In addition, the lower electrode bias frequency can range from about 0.1 MHz to about 100 MHz, e.g., 2 MHz. The treatment time can be approximately 1 to approximately 200 seconds, e.g., about 5 to about 30 seconds.

In this example, a method of selectively removing surface layers of the line pattern treated with a nitrogen-containing plasma is described. The selective etching process comprises a process chemistry having $CF_4$, $CHF_3$, Ar, CO, and $CO_2$. A process parameter space can comprise a chamber pressure of about 100 mTorr, a $CF_4$ process gas flow rate of about 50 sccm a $CHF_3$ process gas flow rate of about 90 sccm, a Ar process gas flow rate of about 400 sccm, a $CO_2$ process gas flow rate of about 50 sccm, a CO process gas flow rate of about 100 sccm, an upper electrode (e.g., element 70 in FIG. 5) RF bias of about 0 W, and a lower electrode (e.g., element 20 in FIG. 5) RF bias of about 450 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz. The treatment time can be approximately 1 to approximately 200 seconds, e.g., about 5 to about 60 seconds.

Using the above treatment process and selective etching process, line patterns were processed in a dense line spacing and an isolated line spacing. Additionally, using the above treatment process and selective etching process, line patterns were processed at a nominal line width (approximately 100 nm) and at three times (3×) the nominal line width. The inventor has observed that using the treatment process and the selective etching process leads to reduced surface roughness on surfaces of the line pattern (i.e., reduced "pitting" on horizontal surfaces), while shifts in critical dimension (CD shift) remain approximately the same (as untreated line patterns) or marginally reduced (or improved).

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of treating a dielectric layer on a substrate, comprising:
   forming said dielectric layer on said substrate, wherein said dielectric layer comprises a dielectric constant value less than the dielectric constant of $SiO_2$;
   forming a feature pattern in said dielectric layer using an etching process;
   following said etching process, treating said feature pattern using a nitrogen-containing plasma to facilitate nitridation of exposed surface layers of said dielectric layer to form nitride surface layers by introducing a process gas consisting of a nitrogen-containing gas and an optional inert gas to exposed surfaces of said dielectric layer in said feature pattern; and
   selectively etching said feature pattern to fully remove said nitride surface layers prior to forming a barrier layer in preparation of a metallization process.

2. The method of claim 1, wherein said forming said dielectric layer comprises forming a dielectric layer having Si, C, and O.

3. The method of claim 2, wherein said forming said dielectric layer comprises forming a dielectric layer having Si, C, O, and H.

4. The method of claim 1, wherein said forming said dielectric layer comprises forming a dielectric layer having a dielectric constant value less than 3.

5. The method of claim 1, wherein said forming said dielectric layer comprises forming a dielectric layer having a dielectric constant value less than 2.5.

6. The method of claim 1, wherein said forming said dielectric layer comprises forming a porous dielectric layer.

7. The method of claim 1, wherein said forming said feature pattern comprises forming a dual damascene structure in said dielectric layer.

8. The method of claim 1, further comprising:
   forming a silicon nitride layer between said dielectric layer and said substrate.

9. The method of claim 8, wherein said forming said feature pattern comprises forming a trench and via structure in said dielectric layer.

10. The method of claim 9, wherein said selectively etching said feature pattern comprises using a selective etching process to transfer the via pattern of said trench and via structure to said silicon nitride layer.

11. The method of claim 1, wherein said process gas consists of nitrogen ($N_2$).

12. The method of claim 1, wherein said process gas consists of nitrogen ($N_2$) and an inert gas.

13. The method of claim 1, wherein said nitrogen-containing gas consists of $N_2$, NO, $NO_2$, $N_2O$, or $NH_3$, or a combination of two or more thereof.

14. A method of smoothing a dielectric layer on a substrate, comprising:
   forming said dielectric layer on said substrate, wherein said dielectric layer comprises a dielectric constant value less than the dielectric constant of $SiO_2$;
   forming a feature pattern in said dielectric layer using an etching process;
   nitriding one or more surfaces on said feature pattern to form one or more nitride surface layers using a nitrogen-containing plasma formed using a process gas consisting of a nitrogen-containing gas and an optional inert gas; and
   following said nitriding, selectively etching said feature pattern to fully remove said one or more nitride surface layers prior to forming a barrier layer in preparation of a metallization process.

15. A liner removal process, comprising:
   forming a contact or via structure in a dielectric layer using a first etching process;
   exposing said contact or via structure in said dielectric layer to a nitrogen-containing plasma formed using a process gas consisting of a nitrogen-containing gas and an optional inert gas; and
   following said exposing, etching said contact or via structure through a silicon nitride layer underlying said dielectric layer using a second etching process prior to forming a barrier layer in preparation of a metallization process.

16. The method of claim 15, wherein said forming said contact or via structure comprises forming a dual damascene structure.

17. The method of claim 15, wherein said forming said contact or via structure comprises forming a contact or via structure in a dielectric layer having Si, C, O, and optionally H.

18. The method of claim 15, wherein said exposing said contact or via structure to said nitrogen-containing plasma comprises exposing said contact or via structure to a nitrogen-containing plasma formed using a process gas consisting of nitrogen ($N_2$).

19. The method of claim 15, further comprising:
   stopping said first etching process when said silicon nitride layer is reached.

20. The method of claim 15, wherein said etching said contact or via structure through said silicon nitride layer using said second etching process comprises using an etching process that is more selective to silicon nitride than said dielectric layer.

* * * * *